United States Patent
Kristl et al.

(10) Patent No.: US 11,882,648 B2
(45) Date of Patent: Jan. 23, 2024

(54) DIELECTRIC LAYER FOR COMPONENT CARRIER WITH VARYING MATERIAL PROPERTIES

(71) Applicant: AT&S Austria Technologie & Systemtechnik Aktiengesellschaft, Leoben (AT)

(72) Inventors: Thomas Kristl, Trofaiach (AT); Dominik Wilding, Zeltweg (AT)

(73) Assignee: AT&S Austria Technologie & Systemtechnik AG, Leoben (AT)

( * ) Notice: Subject to any disclaimer, the term of this patent is extended or adjusted under 35 U.S.C. 154(b) by 0 days.

(21) Appl. No.: 17/213,861

(22) Filed: Mar. 26, 2021

(65) Prior Publication Data
US 2021/0315093 A1 Oct. 7, 2021

(30) Foreign Application Priority Data
Apr. 1, 2020 (EP) .................. 20167588

(51) Int. Cl.
*H05K 1/02* (2006.01)
*H05K 1/03* (2006.01)
*H05K 3/00* (2006.01)

(52) U.S. Cl.
CPC ........... *H05K 1/024* (2013.01); *H05K 1/028* (2013.01); *H05K 1/0243* (2013.01); *H05K 1/0306* (2013.01); *H05K 3/0067* (2013.01)

(58) Field of Classification Search
CPC ........ H05K 1/02; H05K 1/024; H05K 1/0243; H05K 1/028; H05K 1/0306; H05K 3/0067
USPC ....................................... 174/255
See application file for complete search history.

(56) References Cited

U.S. PATENT DOCUMENTS

| | | |
|---|---|---|
| 2002/0148640 A1 | 10/2002 | Holl et al. |
| 2017/0241039 A1 | 8/2017 | Takai |
| 2018/0146548 A1 | 5/2018 | Haon et al. |
| 2021/0294416 A1* | 9/2021 | Nishigori ............ G06F 3/01 |
| 2023/0078373 A1* | 3/2023 | Kim ............ H10N 70/823 |

FOREIGN PATENT DOCUMENTS

| | | |
|---|---|---|
| DE | 102018212310 A1 | 1/2020 |
| JP | H0758429 A | 3/1995 |
| JP | H7106812 A | 4/1995 |
| WO | 2017017127 A1 | 2/2017 |

OTHER PUBLICATIONS

Schweiger, D.; Extended European Search Report in Application No. 20167588.1; pp. 1-11; dated Jan. 19, 2021; European Patent Office; 80298, Munich, Germany.
Schweiger, D.; Partial European Search Report in Application No. 20167588.1; pp. 1-12; dated Sep. 29, 2020; European Patent Office; 80298, Munich, Germany.

* cited by examiner

*Primary Examiner* — Tremesha S Willis
(74) *Attorney, Agent, or Firm* — Robert A. Blaha; Smith Tempel Blaha LLC

(57) ABSTRACT

A dielectric layer for manufacturing a component carrier is described. The dielectric layer includes a first section including a first material having a first material property; and a second section including a second material having a second material property. The second material property is different from the first material property. A method for manufacturing such a component carrier and a component carrier including such a dielectric layer is further described.

15 Claims, 2 Drawing Sheets

DIELECTRIC LAYER FOR COMPONENT CARRIER WITH VARYING MATERIAL PROPERTIES

CROSS-REFERENCE TO RELATED APPLICATION

The present application claims the benefit of the filing date of the European Patent Application No. 20 167 588.1, filed Apr. 1, 2020, the disclosure of which is hereby incorporated herein by reference.

TECHNICAL FIELD

Embodiments of the invention generally relate to the technical field of component carriers which in electronic applications may be used as support structures for building up electronic assemblies (i.e., electronic circuits comprising at least one electronic component) or as substrates for carrying integrated (semiconductor) circuit chips. Specifically, embodiments of the present invention relate to component carriers and methods for manufacturing the same, which component carriers exhibit different electric and/or mechanical properties in different regions.

TECHNOLOGICAL BACKGROUND

A component carrier such as a Printed Circuit Board (PCB) is a support structure for at least one electronic component forming an electronic assembly respectively an electronic circuit. Conductor traces representing an interconnecting wiring are formed from a thin metal layer comprising in particular copper. The conductor traces are formed by means of an appropriate structuring or patterning of an electrically conductive layer which is provided on top or beneath of an electrically insulating layer. An electronic component may be mounted on an upper or lower surface of a component carrier. In some applications, an electronic component is embedded at least partially within (the volume of) a component carrier.

Due to the permanently increasing miniaturization of electronic assemblies, which miniaturization is expected to continue also in the future, there is a continuous need for component carriers which specifically met application specific requirements within a small available space. Such requirements are e.g., mechanical properties such as the young modulus or electric properties such as the dielectric constant being relevant in particular for High Frequency (HF) applications. In order to meet different requirements within a minimum available space it is known to design a component carrier which exhibits such different properties in different spatial regions.

A component carrier with different mechanical properties in different regions is for instance a so-called rigid flex PCB. A rigid-flex PCB is a hybrid construction comprising rigid and flexible substrate portions which are laminated together into a single structure.

JP H 0 758 429 A discloses a PCB which comprises different electric properties in different regions. This disclosed PCB comprises an insulating substrate having a locally different dielectric constant. In order to achieve different dielectric constants recesses of different forms are processed into the insulating substrate. The insulating substrate, e.g., epoxy resin, has a first dielectric constant. In the recesses another material with a differing dielectric constant is inserted. The inserted material may be polyphenylene oxide resin with a dielectric constant of 10. The PCB known from JP H 0 758 429 A has the disadvantage that the formation of the recesses within the insulating substrate is an elaborate and costly procedure. The same holds true for inserting the material of different dielectric constant into these recesses.

SUMMARY

There may be a need for facilitating the fabrication of a component carrier which exhibits, in different spatial regions, different material properties.

This need may be met by the subject matter according to the independent claims. Advantageous embodiments of the present invention are described by the dependent claims.

According to a first embodiment there is provided a dielectric layer for manufacturing a component carrier. The provided dielectric layer comprises (a) a first section comprising a first material having a first material property; and (b) a second section comprising a second material having a second material property. The second material property is different from the first material property.

Overview of Embodiments

The described dielectric layer is based on the idea that in order to fabricate a component carrier having locally different material properties already at least one dielectric layer of the component carrier can be prefabricated with different dielectric materials which are distributed within (the planar extension of) the dielectric layer. This may allow to introduce the different material properties already before manufacturing the component carrier at or within the described dielectric layer, which represents a semifinished product for manufacturing the component carrier. In order to fabricate the component carrier, the described dielectric layer may be, together with at least one other dielectric layer and at least one electrically conductive layer, laminated in order to form a laminated stack representing at least a part of a component carrier.

In some embodiments the described dielectric layer comprises at least one further section comprising a further material having a further material property, wherein the further material property is different both from the second material property and from the first material property. This may allow to specifically design a component carrier for applications which in more than two spatial regions require different specific material properties.

In the context of this document, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

The mentioned component carrier preferably comprises a stack of at least one electrically insulating layer structure and at least one electrically conductive layer structure. For example, the component carrier may be a laminate comprising the described dielectric layer with spatially varying material properties and at least one mentioned electrically conductive layer structure. Optionally, the component carrier may comprise a further described dielectric layer with spatially varying material properties and/or at least one mentioned electrically insulating layer structure. The lamination may be realized in particular by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer, or a plurality of non-consecutive islands within a common plane.

According to an embodiment of the invention the first material and the second material are a laminable material. Alternatively, or in combination the first material and the second material are a printable material.

In the context of this document the term "laminable" may particularly mean that the respective material is a material which is capable of undergoing (later) a lamination procedure. Thereby, the materials may be converted from partially cured (B-stage) to fully cured (C-stage) by applying pressure and/or heat. Connecting the two materials by means of a lamination procedure may provide the advantage that this process can be implemented easily in known and well-established PCB manufacturing processes.

In the context of this document the term "printable" may particularly mean that the two materials may be connected or linked together by means of a printing procedure.

For instance, there are some resin materials which are also printable (in 3D). Further, also an epoxy-based photoresist, e.g., SU-8, can be used as printable material. Using such a photoresist could be an advantage, as it is easy to adapt this procedure within known and well-established PCB manufacturing processes.

According to a further embodiment of the invention (a) the first section is a layer with at least one opening, in particular at least one through opening; and (b) the second material is accommodated (as a layer element) within the at least one opening. Thereby, the (at least one) second section may be inserted within the (at least one) opening with a form closure.

The described dielectric layer may be fabricated in an effective manner by punching out the openings. This means that by contrast to a so-called blind opening the described at least one through opening extends through the entire material thickness of the first section.

According to a further embodiment of the invention (a) the first material property and/or the second material property is a physical, a chemical, and/or a biological property. This may provide the advantage that the described dielectric layer can be used for many different types of applications wherein a component carrier is needed which comprises, in different spatial regions, different types of material properties.

According to a further embodiment of the invention the first material property and/or the second material property is a material property of the group consisting of Young modulus, mechanical robustness, coefficient of thermal expansion, thermal conductivity, electrical conductivity, magnetic permeability, electromagnetic radiation shielding capability, high frequency behavior, rheological properties such as flow behavior, solidification behavior, softening points, halogen content, and solvent content.

The (spatially varying) material properties "Young modulus", "mechanical robustness", and/or "coefficient of thermal expansion (CET)" may contribute to a reduced warpage of a component carrier comprising at least one of the described dielectric layer.

The (spatially varying) material properties "thermal conductivity", "electrical conductivity", "magnetic permeability", "electromagnetic radiation shielding capability", and "high frequency behavior" may be relevant for applications wherein a specific electromagnetic characteristic is required (exclusively) in some selected regions of the described dielectric layer respectively in a component carrier comprising at least one of the described dielectric layer.

The described flow behavior may be of relevance for a desired lamination property during the fabrication of a component carrier.

In particular, the solvent content may be a material property, which is indicative for materials which undergo a hardening, e.g., a resin material.

According to a further embodiment of the invention the dielectric layer comprises at least one of the following features:
(a) A first thickness of the first section is at least substantially the same as a second thickness of the second section.
(b) The dielectric layer has panel format, in particular has a size of at least 12×18 inch$^2$ and further in particular of at least 18×24 inch$^2$.

A uniform thickness may provide the advantage that the described dielectric layer can be realized as a continuous layer which can be used for fabricating the component carrier, wherein known and approved PCB manufacturing methods and processes can be employed.

In this context it should be understood that the terms "the same" and "uniform" are parameters which are never 100% fulfilled. Deviations from −10% to +10% may be allowable.

Realizing the described dielectric layer in a panel format may provide the advantage that the described dielectric layer can be used for manufacturing component carrier which have a size corresponding to standard sizes used for manufacturing PCBs.

According to a further embodiment of the invention at least one of the first material and the second material comprises a curable material, in particular a curable material capable of cross-linking and/or polymerizing by the application of heat and/or pressure. This may provide the advantage that the described dielectric layer can be used for a laminating procedure wherein, without the need of additional laminable materials, the dielectric layer represents a part of a laminated stack.

In some embodiments the first material is a first resin, and the second material is a second resin, wherein the second resin is different from the first resin. Since resin materials are widely used for manufacturing PCBs the described dielectric layer can be employed in known and approved PCB manufacturing methods and processes. Hence, there will be no need to strongly change or adapt such methods and processes. Descriptively speaking, the described dielectric layer is ready to be used in known PCB manufacturing technology.

In some or other embodiments at least one of the first section and the second section is made of a prepreg material layer, wherein in particular the first section comprises a first (type of) prepreg material and the second section comprises a second (type of) prepreg material, the second (type of) prepreg material being different from the first (type of) prepreg material. The handling of prepreg material layers is, although being sticky or adhesive when being in an at least partially uncured state, comparatively easy and is well known from approved PCB manufacturing processes. Hence, using prepreg material layer(s) allows to fabricate the described dielectric layer (as a semifinished product) is an easy and in particular in a reliable manner.

According to a further embodiment of the invention, within a border region between the first section and the second section, the first material is cross-linked at least partially with the second material. With the described cross-linking, the dielectric layer may exhibit a comparatively large structural respectively mechanical stability. In particular the risk that during a handling of the dielectric layer there might occur an unwanted separation of the second section(s) from the first section(s) or vice versa may be reduced significantly.

According to a further embodiment of the invention the dielectric layer comprises at least one of the following features:
(a) At least one of the first material and the second material is made or comprises a solid material;
(b) At least one of the first material and the second material is made or comprises a liquid material, a granulate, a paste, or a partially cured material (B-stage material).

A solid material may provide the advantage that the described dielectric layer may exhibit a high structural stability. This may facilitate a handling of the dielectric layer (as a semifinished product) in particular before a lamination procedure.

The solid material may be e.g., a cured material. Thereby, the curing may have been accomplished before or after attaching the respective section to the other section. In case the curing is carried out after attaching the different sections to each other the curing may be realized with a continuous or spatially structured illumination with electromagnetic radiation, in particular with ultraviolet (UV) radiation.

In preferred embodiments the second material is substantially a partially cured (B-stage) material having e.g., a crosslinking below 90%. Such a material will permeate with adjacent material during a further curing, lamination, heat and/or pressure exposure.

According to a further embodiment of the invention the dielectric layer comprises at least one of the following features:
(a) At least one of the first material and the second material comprises reinforcing particles, in particular glass fibers or glass spheres;
(b) At least one of the first material and the second material is free from reinforcing particles, in particular free from glass fibers and glass spheres;
(c) The first material has a first type of filler particles and the second material has a second type of filler particles being different from the first type of filler particles.

Adding reinforcing particles may provide the advantage that the structural stability of the described dielectric layer may be (further) increased.

A section being free from reinforcing particles may allow to easily select or adjust its material property to a (locally) desired material property.

The difference between the first type and the second type of filler particles may be the size and/or the shape of the filler particles. Suitable filler particles may have glass fibers, glass spheres, normal-sized glass spheres and so-called nano-fillers.

According to a further aspect of the invention there is provided a method of manufacturing a component carrier. The provided method comprises (the step of) laminating a stack comprising at least one electrically conductive layer structure and at least one electrically insulating layer structure, wherein at least one of the at least one electrically insulating layer structure is configured as a dielectric layer with at least one spatially varying material property as described above.

The provided method is based on the idea that the above-described dielectric layer can be used to form a component carrier with at least one spatially varying material property in an easy and effective manner. Thereby, a known lamination procedure can be employed.

According to a further aspect of the invention there is provided a component carrier. The provided component carrier comprises a laminated stack comprising at least one electrically conductive layer structure and at least one electrically insulating layer structure. The at least one of the at least one electrically insulating layer structure is a dielectric layer with different sections having different material properties, wherein materials of the sections are mutually permeated at interfaces between different sections.

Also, the described component carrier is based on the idea that locally different material properties can be provided in an easy and effective manner by using at least one (prefabricated) dielectric layer having different dielectric materials which are spatially distributed within the dielectric layer.

According to a further embodiment of the invention the component carrier further comprises a component embedded in the stack, in particular at or next to the dielectric layer. This may provide the advantage that the embedded component can be placed in the vicinity of a material having a property which is specifically suitable e.g., for the operational reliability of the embedded component.

According to a further embodiment of the invention the embedded component is adjacent to a section of the dielectric layer which section comprises a material having a lower Young modulus than at least one other section of the dielectric layer. This may allow to suppress an unwanted warpage resulting from the embedded component caused by a lamination procedure and/or caused by an operation of the component which operation is accompanied with the generation of heat.

According to a further embodiment of the invention the embedded component is adjacent to a section of the dielectric layer which section comprises a material having a higher thermal conductivity than at least one other section of the dielectric layer. This may provide the advantage that the component carrier is capable of removing heat specifically in those regions where a good heat dissipation is required.

In the following further considerations are presented which may be relevant at least for some embodiments of the invention.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (Teflon), a ceramic, and a metal oxide. Reinforcing materials such as webs, fibers, or spheres, for example made of glass (multilayer glass) may be used as well. Although prepreg particularly FR4 are usually preferred for rigid PCBs, other materials in particular epoxy-based build-up film or photo-imageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer, or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In some embodiments, the component carrier is a laminate-type component carrier representing a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, etc.

It has to be noted that embodiments of the invention have been described with reference to different subject matters. In particular, some embodiments have been described with reference to apparatus type claims whereas other embodiments have been described with reference to a method type claim. However, a person skilled in the art will gather from the above and the following description that, unless other notified, in addition to any combination of features belonging to one type of subject matter also any combination between features relating to different subject matters, in particular between features of the method type claim and features of the apparatus type claims is considered as to be disclosed with this document.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION OF ILLUSTRATED EMBODIMENTS

It is noted that in different figures, similar or identical elements or features are provided with the same reference signs or with reference signs, which are different from the corresponding reference signs only within the first digit. In order to avoid unnecessary repetitions, elements, or features, which have already been elucidated with respect to a previously described embodiment, are not elucidated again at a later position of the description.

Figure 1:
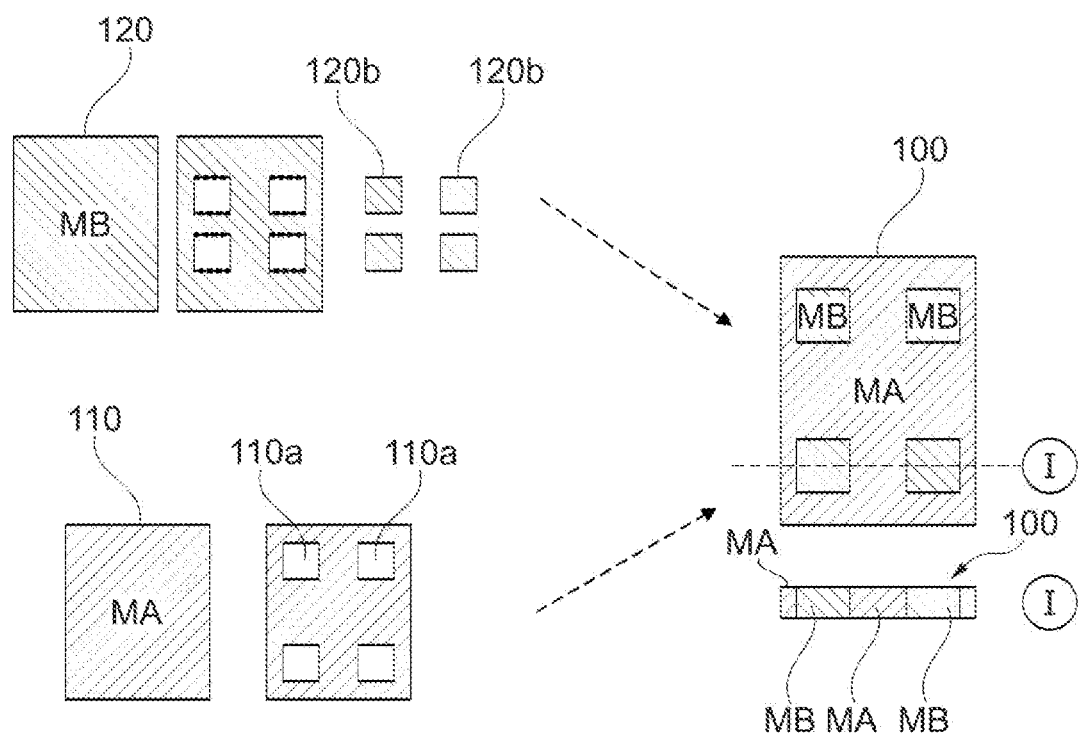
FIG. 1 illustrates a fabrication of a dielectric layer with spatially varying material properties by punching out complementary material pieces from two different dielectric layers and assembling the complementary material pieces.

FIG. 1 illustrates a fabrication of a dielectric layer 100 in accordance with an embodiment of the invention. As can be taken from the top left portion of FIG. 1, a dielectric layer 120 consisting of a uniform dielectric material MB gets cut into spatially defined material pieces 120b. Thereby, a punching out procedure can be employed. Further, as can be taken from the bottom left portion of FIG. 1, a dielectric layer 110 consisting of a uniform dielectric material MA is also punched such that within the dielectric layer 110 punched out recesses or cavities 110a are formed. Thereby, the recesses 110a extend through the entire thickness of the dielectric layer 110. The size of respectively one of the material pieces 120b corresponds to the size of respectively one of the recesses or cavities 110a.

As can be taken from the right portion of FIG. 1, the material pieces 120b are inserted into the recesses or cavities 110a. As a result, the dielectric layer 100 comprises regions made from the dielectric material MA and other regions made from the (different) dielectric material MB. Thereby, both dielectric materials MA and MB have the same thickness. This results in that the dielectric layer 100, although consisting of different materials with different material properties, has a uniform thickness. This is visualized in the cross-sectional view of the resulting dielectric layer 100 depicted in FIG. 1 at left (below the top view of the dielectric layer 100).

It is mentioned that depending on the types of the source dielectric materials MA and MB a mixture of different material properties in one and the same dielectric layer 100 is possible. Exemplary material properties are for instance
low/high dielectric permittivity,
low/high elastic modulus,
low/high halogen content,
presence/absence of glass fibers, and
low/high Coefficient of Thermal Expansion (CTE).

Figure 2:
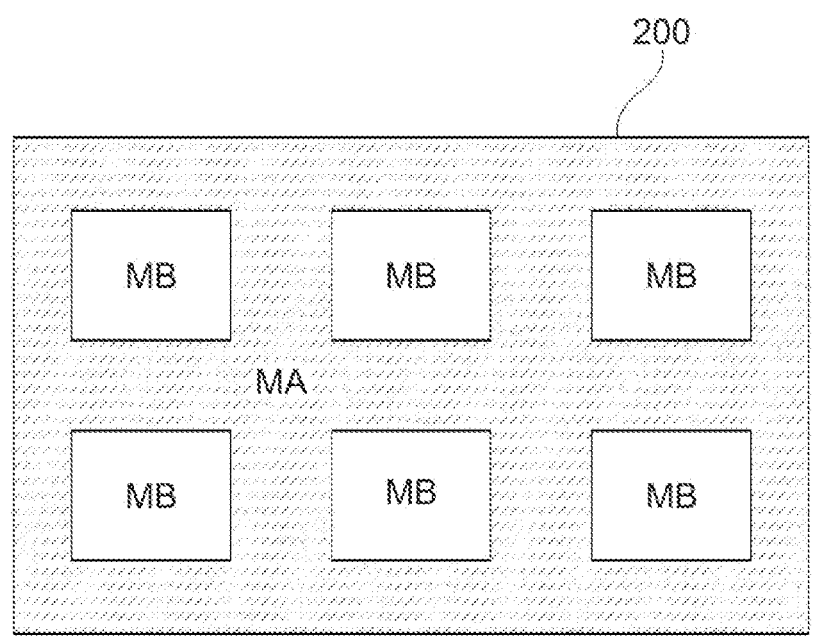
FIG. 2 shows in a top view a dielectric layer comprising six insertions of a dielectric material B placed within spatially corresponding cut outs formed within a dielectric layer made from a dielectric material A.

FIG. 2 shows in a top view a dielectric layer 200 comprising six insertions of a dielectric material MB placed within spatially corresponding cut outs formed within a dielectric layer made from a dielectric material MA. According to the exemplary embodiment described here both dielectric materials are prepreg materials.

Further, according to the exemplary embodiment described here the dielectric prepreg material MB provides a functional material property which is suitable for a non-depicted embedded component being located below the respective material piece MB. Thereby, the functional material property may be for instance a good heat transfer capability for dissipating heat generated within the respective embedded component during operation. The material property of the prepreg material MA, which is located farer off the non-depicted embedded components, may be for instance a low elastic modulus. This may allow to reduce an unwanted warpage of a component carrier comprising the entire dielectric layer 200.

Figure 3:
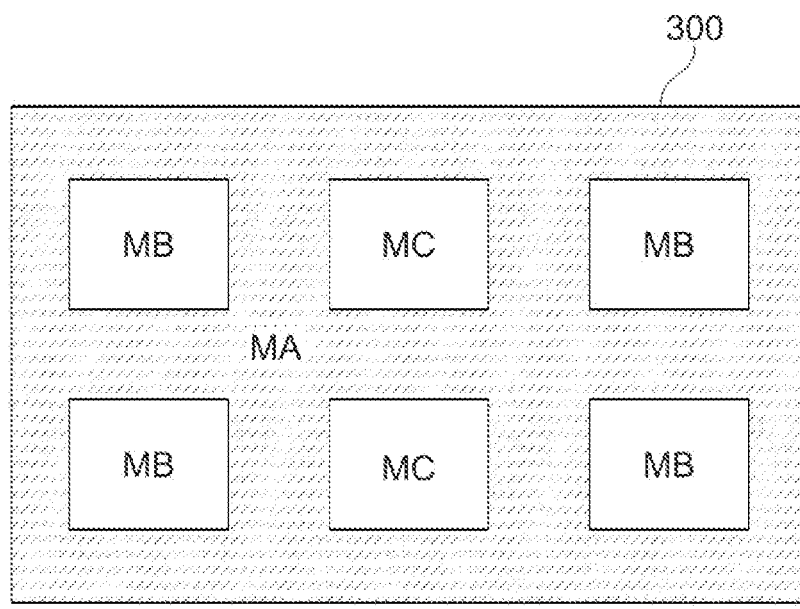
FIG. 3 shows in a top view a dielectric layer comprising four insertions of a dielectric material B and two insertions of a dielectric material C placed within spatially corresponding cut outs formed within a dielectric layer made from a dielectric material A.

FIG. 3 shows in a top view a dielectric layer 300 according to a further embodiment of the invention. The dielectric layer 300 comprises (a) four material insertions of a dielectric material MB and (b) two material insertions of a dielectric material MC. All the material insertions are located within spatially corresponding cutouts formed within a basic dielectric layer made from a dielectric material MA.

Figure 4:
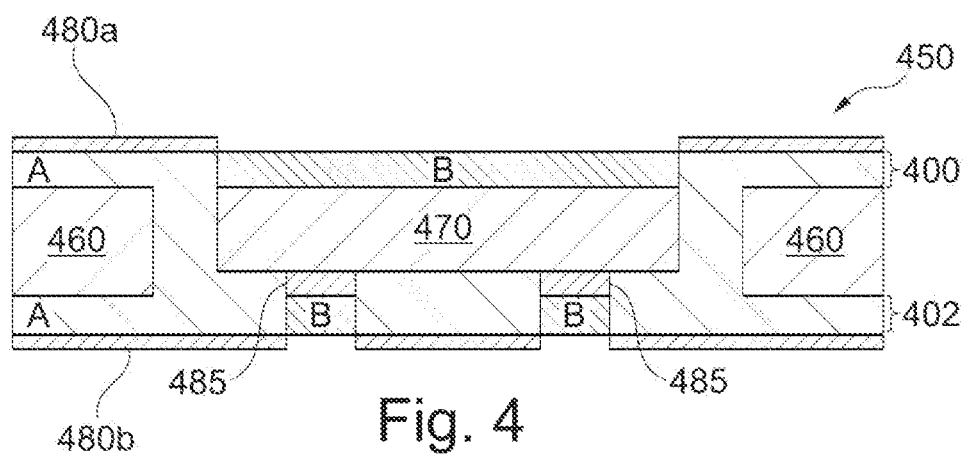
FIG. 4 shows a component carrier with an embedded component and two dielectric layers each having varying material properties.

FIG. 4 shows a component carrier 450 with an embedded component 470 and two dielectric layers each having spatially different or varying material properties. One dielectric layer 400 (with varying material properties) is located above the embedded component 470 and a further dielectric layer 402 (with varying material properties) is located below the embedded component 470.

The embedded component 470 is located without a recess formed within a core 460 of the component carrier 450. The size of the recess is slightly larger than the size of the embedded component 470. This means that the embedded component 470 is not in direct mechanical contact with the core 460. Instead, there is a dielectric material A, which is also comprised in the two dielectric layers 400 and 402, which accommodates the embedded component 470.

As can be taken from FIG. 4, the upper dielectric layer 400 comprises a dielectric material A with a comparatively large insert of a dielectric material B. The lower dielectric layer 402 comprises the dielectric material A with two comparatively small inserts of the dielectric material B. According to the exemplary embodiment described here the dielectric material B is a material which can be etched (easily) by a usual plasma etching procedure. For such a plasma etching procedure the/a concept of conformal masks can be employed.

It is mentioned that it is also possible to choose a dielectric material B with a sufficiently higher etch rate than material A. Hence, the sections with material A can be etched away much easier. Such a difference in the capability to be etched may provide the advantage that there is no need to add a conformal mask at all as the sections with material A are more readily etchable. Thereby, voids may be realized without a need to employ laser radiation or mechanical drilling.

Specifically, an opening within an upper metal/copper layer 480a can be used for a spatially selective plasma etching process at the upper side of the component 470. Thereby, the upper surface of the component 470 can be exposed. Further, two openings within a lower metal/copper layer 480b can be used for a spatially selective plasma etching process at the lower side of the component 470. Thereby, contact pads 485 of the component 470 may be exposed in order to electrically connect, with non-depicted further process steps, the component 470 to further non-depicted electric circuitry.

Employing the conformal mask concept in connection with the use of a proper plasma etchable material B may provide the advantage that the component 470 can be (partially) exposed without causing a large thermal stress for the component 470.

Figure 5:
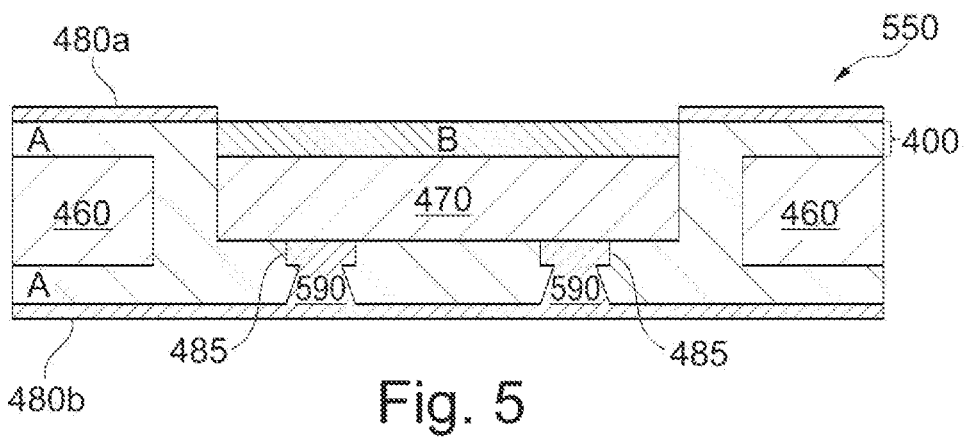
FIG. 5 shows a component carrier with an embedded component and one dielectric layer having varying material properties.

FIG. 5 shows a component carrier 550 in accordance with a further embodiment of the invention. The component carrier 550 may result from a further processing of the component carrier 450 depicted in FIG. 4. Thereby, the two small regions with the material B at the bottom side have been removed by plasma etching and the resulting voids have been filled with an electrically conductive material in order to form metallic interconnects 590. These metallic interconnects 590 are used for electrically connecting the embedded component 470 with a so far not structured/patterned metal layer 480b.

According to the exemplary embodiment described here the material B exhibits improved heat transfer properties as compared to the material A. This provides for a better heat transfer away from the component to outer non-depicted layer(s) of the component carrier 550. The material B may be for instance a thermo prepreg material or a heat transfer paste.

It should be noted that the term "comprising" does not exclude other elements or steps and the use of articles "a" or "an" does not exclude a plurality. Also, elements described in association with different embodiments may be combined. It should also be noted that reference signs in the claims should not be construed as limiting the scope of the claims.

LIST OF REFERENCE SIGNS 100 dielectric layer with varying material properties
110 dielectric material A
110a punched out recess
120 dielectric material B
120b punched out material piece
MA dielectric material A
MB dielectric material B
MC dielectric material C
200 dielectric layer with varying material properties
300 dielectric layer with varying material properties
400 dielectric layer with varying material properties
402 further dielectric layer with varying material properties
450 component carrier
460 core structure
470 embedded component
480a metal layer/copper layer
480b metal layer/copper layer
485 contact pad
A dielectric material A
B dielectric material B
550 component carrier
590 metallic interconnect

The invention claimed is:

1. A printed circuit board or an IC substrate, the printed circuit board or the IC substrate having a dielectric layer, the dielectric layer comprising:
    a first section comprising a first material having a first material property; and
    a second section comprising a second material having a second material property;
    wherein the second material property is different from the first material property,
    wherein, within a border region between the first section and the second section, the first material is cross-linked at least partially with the second material,
    wherein the first material and the second material are laminated, and
    wherein, one of the first section and the second section is surrounded by the other section.

2. The printed circuit board or the IC substrate according to claim 1, wherein the first material and the second material of the dielectric layer are printable materials.

3. The printed circuit board or the IC substrate according to claim 1, wherein the first section is a layer with at least one opening and the second material is accommodated within the at least one opening.

4. The printed circuit board or the IC substrate according to claim 1, wherein the first material property and/or the second material property is a physical, a chemical, and/or a biological property.

5. The printed circuit board or the IC substrate according to claim 1, wherein the first material property and/or the second material property is a material property of the group consisting of Young modulus, mechanical robustness, coefficient of thermal expansion, thermal conductivity, electrical conductivity, magnetic permeability, electromagnetic radiation shielding capability, high frequency behavior, rheological properties such as flow behavior, halogen content, and solvent content.

6. The printed circuit board or the IC substrate according to claim 1, wherein the dielectric layer comprises at least one of the following features:
    (a) a first thickness of the first section is the same as a second thickness of the second section;
    (b) the dielectric layer has a panel format.

7. The printed circuit board or the IC substrate according to claim 1, wherein at least one of the first material and the second material comprises a curable material capable of cross-linking and/or polymerizing by the application of heat and/or pressure.

8. The printed circuit board or the IC substrate according to claim 1, wherein the dielectric layer comprises at least one of the following features:
    (a) at least one of the first material and the second material is made or comprises a solid material; and
    (b) at least one of the first material and the second material is made or comprises a liquid material, a granulate, a paste, or a material that is partially cured.

9. The printed circuit board or the IC substrate according to claim 1, wherein the dielectric layer comprises at least one of the following features:
    (a) at least one of the first material and the second material comprises reinforcing particles;
    (b) at least one of the first material and the second material is free from reinforcing particles; and
    (c) the first material has a first type of filler particles and the second material has a second type of filler particles being different from the first type of filler particles.

10. A method for manufacturing a printed circuit board or an IC substrate, the printed circuit board or the IC substrate having a dielectric layer, the method comprising:
    laminating a stack comprising at least one electrically conductive layer structure and at least one electrically insulating layer structure, wherein at least one of the at least one electrically insulating layer structure is configured as the dielectric layer comprising
    a first section comprising a first material having a first material property; and
    a second section comprising a second material having a second material property;
    wherein the second material property is different from the first material property,
    at least partially cross-linking the first material of the first section with the second material of the second section within a border region between the first section and the second section,
    wherein the first material and the second material are laminated, and
    wherein one of the first section and the second section is surrounded by the other section.

11. A component carrier comprising a printed circuit board or an IC substrate, the printed circuit board or the IC substrate having a dielectric layer and comprising:
    a laminated stack comprising at least one electrically conductive layer structure and at least one electrically insulating layer structure;
    wherein at least one of the at least one electrically insulating layer structure is the dielectric layer having different sections with different material properties,
    wherein materials of the sections are mutually permeated at interfaces between different sections,
    wherein, within a border region between a first section of a first material and a second section of a second material, the first material is cross-linked at least partially with the second material,
    wherein the first material and the second material are laminated, and
    wherein one of the first section and the second section is surrounded by the other section.

12. The component carrier according to claim 11, further comprising:
    a component embedded in the stack at or next to the dielectric layer.

13. The component carrier according to claim 12, wherein the component embedded in the stack is adjacent to a section of the dielectric layer which section comprises a material having a lower Young modulus than at least one other section of the dielectric layer.

14. The component carrier according to claim 13, wherein the component embedded in the stack is adjacent to a section of the dielectric layer which section comprises a material having a higher thermal conductivity than at least one other section of the dielectric layer.

15. A printed circuit board or an IC substrate, comprising:
    a stack with at least one electrically conductive layer structure and at least one electrically insulating layer structure, wherein the at least one electrically insulating layer structure is configured as a dielectric layer,
    the dielectric layer comprising a first section with a first material having a first material property and a second section with a second material having a second material property,
    wherein the second material property is different from the first material property,
    wherein the first material and the second material are laminated, and
    wherein, one of the first material property and the second material property is a spatially varying material property.

* * * * *